(12) United States Patent
Tao et al.

(10) Patent No.: US 7,531,203 B2
(45) Date of Patent: May 12, 2009

(54) METHOD FOR THE PRODUCTION OF CONDUCTIVE FLEXIBLE TEXTILE ARRAYS

(75) Inventors: Xiaoming Tao, Kowloon (CN); Sarah Mei-Yi Leung, Kowloon (CN); Marcus Chun-Wah Yuen, Kowloon (CN); Wing-Yin Kwok, Kowloon (CN); Hoi-Lut Ho, Kowloon (CN)

(73) Assignee: The Hong Kong Polytechnic University, Kowloon, Hong Kong SAR (CN)

( * ) Notice: Subject to any disclaimer, the term of this patent is extended or adjusted under 35 U.S.C. 154(b) by 487 days.

(21) Appl. No.: 11/029,647

(22) Filed: Jan. 6, 2005

(65) Prior Publication Data

US 2006/0148351 A1 Jul. 6, 2006

(51) Int. Cl.
*B05D 5/12* (2006.01)

(52) U.S. Cl. .................. 427/58; 427/255.6; 427/446; 427/551; 427/553; 427/256; 427/282; 427/353; 427/421.1; 427/428.01

(58) Field of Classification Search ............. 427/255.6, 427/256, 282, 356, 421, 428.1, 58, 446, 551, 427/553, 353, 421.1, 428.01
See application file for complete search history.

(56) References Cited

U.S. PATENT DOCUMENTS

| | | | | |
|---|---|---|---|---|
| 3,954,100 | A * | 5/1976 | Sem-Jacobsen | 600/393 |
| 4,795,998 | A * | 1/1989 | Dunbar et al. | 338/5 |
| 5,030,508 | A * | 7/1991 | Kuhn et al. | 442/115 |
| 5,102,727 | A * | 4/1992 | Pittman et al. | 442/187 |
| 5,395,508 | A * | 3/1995 | Jolly et al. | 205/129 |
| 5,674,752 | A * | 10/1997 | Buckley et al. | 436/151 |
| 6,083,366 | A * | 7/2000 | Higson | 205/122 |
| 6,381,482 | B1 * | 4/2002 | Jayaraman et al. | 600/388 |
| 7,144,830 | B2 * | 12/2006 | Hill et al. | 442/205 |
| 7,145,432 | B2 * | 12/2006 | Lussey et al. | 338/47 |
| 2004/0095247 | A1 * | 5/2004 | De Haan et al. | 340/573.5 |
| 2005/0130397 | A1 * | 6/2005 | Bentley et al. | 438/584 |
| 2006/0134318 | A1 * | 6/2006 | Hudd et al. | 427/98.4 |
| 2007/0065586 | A1 * | 3/2007 | Tao et al. | 427/299 |

(Continued)

FOREIGN PATENT DOCUMENTS

WO WO 2006/081622 A1 * 8/2006

OTHER PUBLICATIONS

Pacelli, M. et al., "Sensing Fabrics for Monitoring Physiological and Biomechanical Variables: E-textile solutions". Proceedings of the 3rd IEEE-EMBS Sep. 4-6, 2006; pp. 1-4.*

(Continued)

*Primary Examiner*—Bret Chen
(74) *Attorney, Agent, or Firm*—Jacobson Holman PLLC

(57) ABSTRACT

A method for the production of a conductive flexible textile array. The method includes the application of an oxidizing agent to selected areas of the textile; coating the textile with pyrrole by vapor deposition to form a conductive coated textile having a polypyrrole network; stabilizing the conductive coated textile; and forming the conductive flexible textile arrays as a sensor. With this method of production, the degree of polymerization of the conjugated polymer, the morphology and the rate of the capacitance delay is carefully controlled. As such, stable flexible textile sensors are produced with various levels of sensitivities and conductivities which are particularly useful for designed applications.

10 Claims, 4 Drawing Sheets

U.S. PATENT DOCUMENTS

2007/0202765 A1* 8/2007 Krans et al. ............ 442/301

OTHER PUBLICATIONS

Cochrane, Cedric et al., "Design and Development of a Flexible Strain Sensor for Textile Structures Based on a Conductive Polymer Composite". Sensors 2007, 7, pp. 473-492.*
Natarajan, K., et al., "Electrotextiles-Present and Future". MRS Abstract: 2002 Fall Symposium D. no page numbers.*
Foitzik, Richard C., et al., "Conductive poly(a,w-bis(3-pyrrolyl)alkanes)-coated wool fabrics". Synthetic Metals 157 (2007) pp. 534-539.*
Li, Y. et al., "A flexible strain sensor from polypyrrole-coated fabrics". Synthetic Metals 155 (2005) pp. 89-94.*
Najar, Saeed Shaikhzadeh, et al., "Conductive wool yarns by continuous vapour phase polymerization of pyrrole". Synthetic Metals 157 (2007) pp. 1-4.*
Kang, Tae Jin, et al., "Preparation and morphology of electrically conductive and transparent poly(vinylchloride)-polypyrrole composite films". Polymer Bulletin 31, pp. 593-599 (1993).*
Rothmaier, Markus, et al., "Textile Pressure Sensor Made of Flexible Plastic Optical Fibers". Sensors 2008, 8, pp. 4318-4329.*
Rossi et al, Materials Science and Engineering C7, 1999, pp. 31-35, Dresswear: wearable hardware.
Hebner et al, Applied Physics Ltrs., vol. 72, No. 5, Feb. 2, 1998, pp. 519-521, Ink-jet printing of doped polymers for oganic . . . .
Yang et al, Jour. of Mat. Sci. 11, 2000, pp. 89-96, Organic/polymeric electroluminescent devices processed by hybrid . . . .
Mutsumi et al, 1999, Abstract of Low-temperature polysilicon thin-film transistor driving with integrated driver for . . . .
Thieblemont et al, 1994, Abstract of Kinetics of degradation of the electrical conductivity of polypropyrrole under thermal . . . .
White et al, J. Am. Chem. Soc. 106, 1984, pp. 5375-5377, Chemical Derivatization of an Array of Three Gold Microelectrodes . . . .
Fiorillo et al, Sensors & Actuators B, 7, 1992, pp. 392-403, PPy thin layers grown onto copper salt replica for sensor . . . .
Gamier et al, 1994, Abstract of All-polymer field-effect transistor realized by printing techniques.
Bartolomeo et al, Adv. Mat. for Optics and Elec., vol. 2, 1993, pp. 233-236, A Photolithographic Technique for Patterning . . . .
Wuu et al, Jour. of the Electrochemical Soc., Mar. 1989, pp. 885-886, High Resolution Deposition of Polyaniline on Pt with . . . .
Pede et al, Material Science and Engineering C5, 1998, pp. 289-291, Microfabrication of conducting polymer devices by . . . .
Thieblemont et al, Synthetic Metals, 59, 1993, pp. 81-96, Stability of chemically synthesized polypyrrole films.
Troung et al, 1992, pp. 187-195, Thermal Stability of Polypyrroles.
Cheah et al, Synthetic Metals 94, 1998, pp. 215-219, Ordering and stability in conducting polypyrrole.
Ouyang et al, Synthetic Metals 75, 1995, pp. 1-3, Enhancement of the electrical conductivity of polypyrrole films on . . . .

* cited by examiner

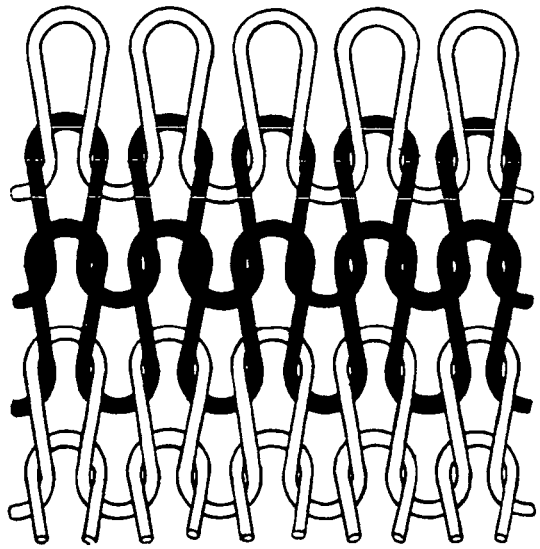
Figure 6a Knitted fabric (course direction)
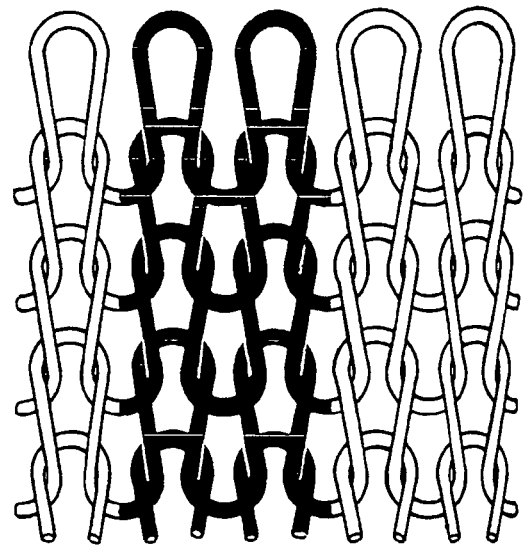
Figure 6b Knitted fabric (wale direction)
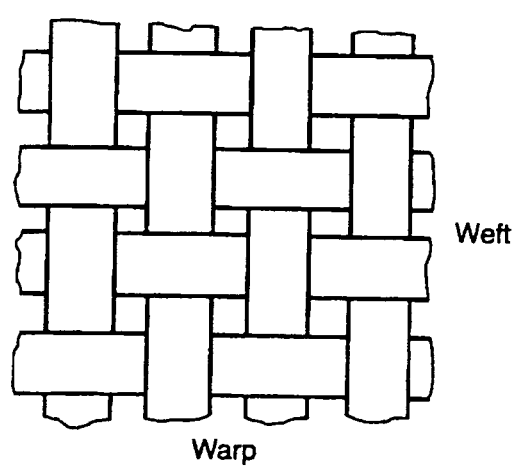
Figure 7 Woven fabric
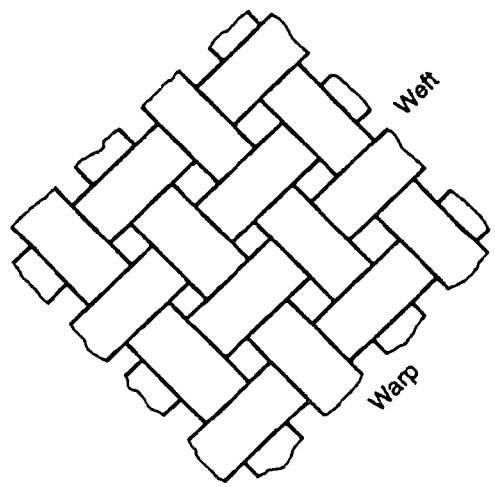
Figure 8 Braid fabric

METHOD FOR THE PRODUCTION OF CONDUCTIVE FLEXIBLE TEXTILE ARRAYS

FIELD OF THE INVENTION

This invention relates generally to methods for the production of conductive flexible textile arrays that may allow simultaneous measurement and control of an array of flexible textile sensors.

BACKGROUND TO THE INVENTION

Conductive textile materials including fibres, filaments, yarns and fabrics made of purely conductive polymers or combination of conductive polymers and traditional textile polymers have been provided in various ways. In U.S. Pat. No. 4,803,096 (1989), Kuhn et al, disclosed a method of coating textile substrates with a layer of electrical conductive polymer.

Takeda in U.S. Pat. No. 4,756,969 (1988), disclosed a method comprising an electrical conductive sheath in between a non-conductive core and outer sheath layers to form a highly conductive composite filament and yarn.

In U.S. Pat. No. 5,736,469 (1998), Bhattachaijee disclosed a method of depositing conductive polymer particles onto non-conductive substrates for manufacturing anti-static textile material.

Alternatively, Kinlen in U.S. Pat. Nos. 6,127,033 and 6,228,492 disclosed a method of manufacturing intrinsically conductive fibre by either extruding two or more filaments wherein at least one is from conductive polymer or by mixing conducting polymer with a matrix solution and other organic solvent in a spinning solution for wet-spinning into filaments.

Rodriguez, in U.S. Pat. No. 5,736,469 describes a process of manufacturing bi-component conductive filament with both conductive and non-conductive components within the filament and yarn.

The above important inventions on electrically conductive textiles have been suggested for use in the control of static, heating by resistance change and attenuation of electromagnetic energy etc. With more and more concern about the design and production of smart wearable hardware or garments, the use of conductive textile materials enters a new stage of development.

Conductive textiles could be used as a radar absorbing materials incorporated into aircraft or wearable garment or-incorporated for producing actuating hardware.

De Rossi et al, in Material Science Engineering, C, 7(1), 31-35 (1998); Dressware: Wearable Hardware, introduced an idea of measuring movement of body segments using conductive polymer It used a glove having sensing areas made of conductive polymer coated textiles and a signal processing unit to transfer signals to a computer for interpretation.

Smela et al, in U.S. Pat. No. 6,360,615 disclosed the idea of the employment of a wearable effect-emitting strain gauge device for producing a variety of smart or intelligent products, including smart garments and accessories. Besides the design and development of signal transfer systems, accurate sensing code or areas are needed. Patterning of textile materials with both conductive and non-conductive areas on textile substrates can provide more accurate measurement of external stimuli.

Pittman et al, earlier disclosed creating electrical conductivity patterns on textile materials. U.S. Pat. No. 5,102,727 discloses blending various density or numbers of conductive and non-conductive filaments in a yarn and fabric.

Gregory et al, in U.S. Pat. No. 5,162,135, prepared textiles with a conductivity gradient by applying a reducing agent to the textile fabrics originally coated with conductive polymer on selective portions. The reducing agent is to reduce the conductivity in selected areas.

Alternatively, in U.S. Pat. No. 5,316,830 by Adams et al, conductive textile fabrics with varying conductive patterns were prepared by removing the conductive coating in selected areas from textile substrates originally coated with conductive polymer. The removal was performed by means of high velocity water jets, sculpturing or similar means.

DeAngelis et al, in U.S. Pat. No. 5,720,892, disclosed a method for removing the coating by chemical etching agents, and an area to remain conductive was coated with protective film before treatment with the chemicals. Similarly, Child in U.S. Pat. No. 6,001,749 disclosed a method of applying finishing on selected areas of textile fabric to inhibit the formation of a conductive polymer coating by an aqueous solution comprising a conductive monomer, Murphy et al, in U.S. Pat. No. 6,210,537, discloses a method of providing electronically conductive polymer films formed from a photosensitive formulation of pyrrole and an electron acceptor on selective areas exposed to UV light, laser light or electron beams.

These prior arts generally provide background for development, but still have limitations. Some of the proposed methods are restricted for use with particular textile materials only. For example the application of high velocity water jets or similar methods are not suitable for natural fibre materials as they may not have sufficient strength to withstand the high impact force. At the same time, some of the methods invented above are either too lengthy or complicated. A more simpler or quicker method of coating substrates with conductive polymer in selected areas is desirable.

Direct printing conductive polymers especially using the inkjet printing or padding on textile substrates are alternatives methods.

Printing is a simple and efficient way to create characters, graphics and various patterning on a substrate. Various printing technologies have been developed such as screen printing and inkjet printing. Inkjet printing is a non-contact dot matrix printing technology in which droplets of ink are jetted from a small aperture directly to a specified position on a media. Inkjet printing is defined as the process of creating print on textile surface that is generated: and designed from computer directly (Klemm, 1999). With the advancement of digital technology and the ease of ink control by computer, the inkjet printing process has received great attention in areas where images and information are created and modified digitally.

Direct printing of functional conducting polymers may provide a new route to low-cost fabrication of conductive textiles.

Inkjet printing has emerged as an attractive patterning technique for conjugated polymers in light-emitting diodes (Hebner, Marcy, Lu & Sturm, 1998, Yang, Chang, Bharathan & Liu, 2000) and full-colour high-resolution displays (Shimoda, 1999).

Different techniques for planar patterning of conjugated polymer devices have already been proposed, ranging from electrochemical deposition (White, Kittelsen & Wrighton, 1984), chemical vapour deposition on salt replica (Fiorillo, Di Bartolomeo, Nannini & De Rossi, 1992), screen printing (Garnier, Hajlaoui, Yassar & Srivastava, 1994), masking and spinning (Di Bartolomeo, Barker, Petty, Adams & Monkman, 1993) to nanopatterning by electrochemical scanning tunnel microscopy (Wuu, Fan & Bard, 1989). All these techniques, although effective in a limited technology domain, suffer drawbacks to some extent and do not fully exploit the potentialities of conjugated polymer device technology.

Two recent technological advances in related areas, i.e. ink-jet printing and stereo-lithography for rapid prototyping (Jacobs, 1992), may allow the development of a new technology for conjugated polymer device micro-fabrication. Relevant to this development are the preliminary reports of 2D (planar) patterning of conducting polymers by inkjet deposition (e Rossi, 1996, McDiarmid, 1996) and construction of 3D ceramic parts by inkjet stereo-lithography. Pede et al described an inkjet stereo-lithographic apparatus purposely designed and constructed for conjugated polymer device micro-fabrication (Pede, Serra & De Rossi, 1998). It exploits the simple working principle of an ink-jet printing head in order to build conjugated polymer device for electronic, sensing or actuating applications.

Fabrication of flexible conductive textile composites in various format have been invented and well known. However, the use of conducting polymer for fabricating high technical and smart flexible textiles is still limited. Important limitations of the use of conducting polymer are the lack of conductivity stability and the control of sensitivity relative to metals and carbon-based materials. In addition, conductive polymer sensors when used as flexible strain sensors, they are also sensitive to the environmental factors such as humidity and temperature etc. Decoupling of the parameters is essential for the development of intelligent flexible products.

The stability of the conductivity of polypyrrole films, prepared either electrochemically or chemically has been discussed in numerous publications. J. C. Thieblemont et al. Hasve published several papers including: Stability of chemically synthesized polypyrrole films (Synthetic Metals 59, (1993) 81-96), and Kinetics of Degradation of the Electrical Conductivity of Polypyrrole under Thermal Aging (Polymer Degradation and Stability 43, (1994) 293-298). In addition, V. T. Truong has published several studies including Thermal Stability of Polypyrroles (Polymer International 27, (1992) 187-195). In their findings the conductivity of polypyrrole films, powders, and coatings decrease over time according to either a diffusion controlled or a first-order decay process. The rate of decay is related to the choice of dopant anion, the method of preparation, and the conditions of the aging. The decay is significantly more rapid in the presence of air, indicating that the reaction of oxygen with the polymer backbone is responsible for a significant portion of the conductivity loss.

Previous studies by researchers suggested that the thermal stability of polypyrrole films can also be controlled through the combination of heat and nitrogen treatment [Truong de al, 1992], treatment of acid or alkaline [Cheah et al, 1998] and application of voltage [Ougyand, 1995]. According to Cheah et al. (1998), enhanced thermal stability can be achieved in PPy with Phenylsulfonate counterions using simple acid and base treatments. The degree of stabilization depended highly on the solution, temperature and treatment time. According to Ougyang (1995), the conductivity of the PPy film doped with TsO$^-$ anions greatly increased after some high voltage (4-6V) was applied on the film. The film with the TsO$^-$ counter-anions shows very good stability. In other words, stability of conducting polymer is highly related to its after-treatment applied for the materials.

Researchers have studied the stability of polypyrrole films and the control of thermal stability of the conductive films. Thermal treatment, nitrogen treatment, oxygen treatment, acid and base treatment, uses of dopants as well as voltage applied have been proved to improve the stability of the polypyrrole films. However, the optimum conditions and the combination of above parameters for the acceleration of the ageing and optimizing the stability performance are still unknown, especially for polypyrrole-coated textiles prepared by various fabrications methods. Besides of the above parameters, control of pressure applied on the treatment will have significant contribution on the control of stability, and can speed up the acceleration process. In addition, previous studies focused mainly on the thermal stability of the polypyrrole films, as for industrial applications thermal stability is one of the most important consideration. However, in textile and apparel application, the stability of the polypyrrole coated textile substrates towards environmental conditions such as temperature, humidity, sweating, UV light and cleaning or caring treatments are of primary importance.

OBJECT OF THE INVENTION

It is an object of the present invention to provide a method for the production of conductive flexible textile arrays that may overcome or alleviate some of the difficulties with the prior constructions or at least provide the public with a useful choice.

SUMMARY OF THE INVENTION

By using the new methods for controlling the degree of polymerization of the conjugated polymer, morphology of the conjugated polymer and the rate of capacitance delay, so that various sensitivity, level of conductivity and stability of flexible textile sensors can be produced for designed applications.

Accordingly, in a first aspect, the invention may broadly be said to consist in a method for the production of conductive flexible textile arrays comprising:

applying an oxidising agent to predetermined/selected areas of the textile;

combining with deposition of pyrrole for the formation of conductive coating by vapour deposition;

controlling the morphology, distribution of polymer aggregates and/or the orientation of the conjugated polymer chains for controlling the sensitivity, stabilization of the conductive; and designing a predetermined patterns array of the conductive textile sensors for decoupling the combined multi-sensing parameters.

Preferably said oxidising agent is applied on textile in predetermined patterns by different methods.

Preferably said oxidising agent is applied on textile in jet spray technique.

Alternatively said oxidising agent is applied by screen printing.

In a further alternative said oxidising agent is applied by inkjet printing.

In a yet further alternative said oxidising agent is applied by padding with mask.

Preferably said the pyrrole is applied by exposure of the textile with the oxidising agent still wet to an atmosphere saturated with pyrrole monomer vapour under a vacuum.

Preferably said deposition occurs at substantially room temperature and continues for approximately 24 hours.

Alternatively said deposition occurs at substantially very low temperature and continues for approximately 72 hours.

Preferably said the morphology, distribution of the aggregates and orientation of the conjugated polymer determined the conductivity, sensitivity, is controlled by the electrical field applied during deposition.

Preferably said the morphology, distribution of the aggregates and orientation of the conjugated polymer determined the conductivity, sensitivity, is controlled by the temperature and vacuum pressure applied during deposition.

Alternatively said the conductivity, sensitivity, is controlled by the wet pick up of the fabric printed with oxidizing agent and vapour deposition.

Preferably said stabilising includes a washing and drying process to age the coating.

Preferably said washing process can be conducted in acidic, alkaline or deionzed water medium.

Preferably said the washed sample is stabilized in the vacuum-dry heat treatment at 60° C. for 1 to 3 days.

Alternatively or additionally said stabilising includes exposing the coated textile to a radiating light source to degrade the outer coating and or influence the orientation of the polymer chain.

Alternatively or additionally said stabilising includes applying an electrical current to the textile after deposition for re-arranging the polymer chain.

Alternatively or additionally said stabilising includes applying an electrical current to the textile during the vapour deposition of the pyrrole onto the textile to control the morphology of the polypyrrole-network coated fabric.

Preferably said multi-sensing parameters of strain, temperature and humidity are decoupled by the array systems of sensors allocated within the wearable product.

Accordingly, in a second aspect, the invention may broadly be said to consist in a flexible textile array sensor as produced by any of the methods above.

BRIEF DESCRIPTION OF THE DRAWINGS

Preferred embodiments of the invention will now be described with reference to the following drawings in which:

FIG. 6 shows an arrangement to apply the patterns to knitted fabrics;

FIG. 7 shows an arrangement to apply the patterns to woven fabrics;

FIG. 8 shows an arrangement to apply the patterns to braid fabrics; and

DETAILED DESCRIPTION OF PREFERRED EMBODIMENTS

This invention relates to patterned conductive textile sensors such as those for simultaneously measurement of strain, temperature and relative humidity. The patterned textile structures comprise sensing elements of various electrical conductivity and they are in the forms of fabrics, fibres, filaments or yarns coated with conductive polymers.

Various patterns have been designed and fabricated for the purposes. Simultaneous measurements can be achieved for principal tensile strains and in-plane shear strain, temperature and humidity by solving the set of simultaneous equations or by incorporate the conductive patterns into the selected anisotropic textile structures, for instance allowing various axes of directional rigidity. The invention also includes new processes for preparing patterned conductive flexible textile sensors with a wide range of conductivity and capacitance, sensitivity to the measurements and good stability. A new method of applying conjugated polymer coating by printing of oxidizing agents prior to vapor deposition was found to have higher strain sensitivity. Individual or a group of filament and yarn may be arranged in a sheet, hank, package, beam forms, woven or knitted into fabrics, and are firstly coated with the oxidizing S agent or dopant on selected areas by printing and thereafter be exposed to conducting monomer for the formation of conducting polymer coating. Application of oxidizing agents or selected dopants on textile substrates may be achieved by digital printing, ink-jet printing, screen-printing, rotary printing, dot-coating, transfer printing or spraying in a wide range of format. The morphology of the conjugated polymer can also be controlled by applying an electrical field on the textile substrate in preferred direction at the process of chemical vapor deposition of conductive monomer.

The invention will now be further illustrated and described with reference to various examples as summarised and then detailed below.

EXAMPLES OF INVENTION

Patterned Textile Sensors

Example 1

Directional Sensing Patterns

Figure 1:
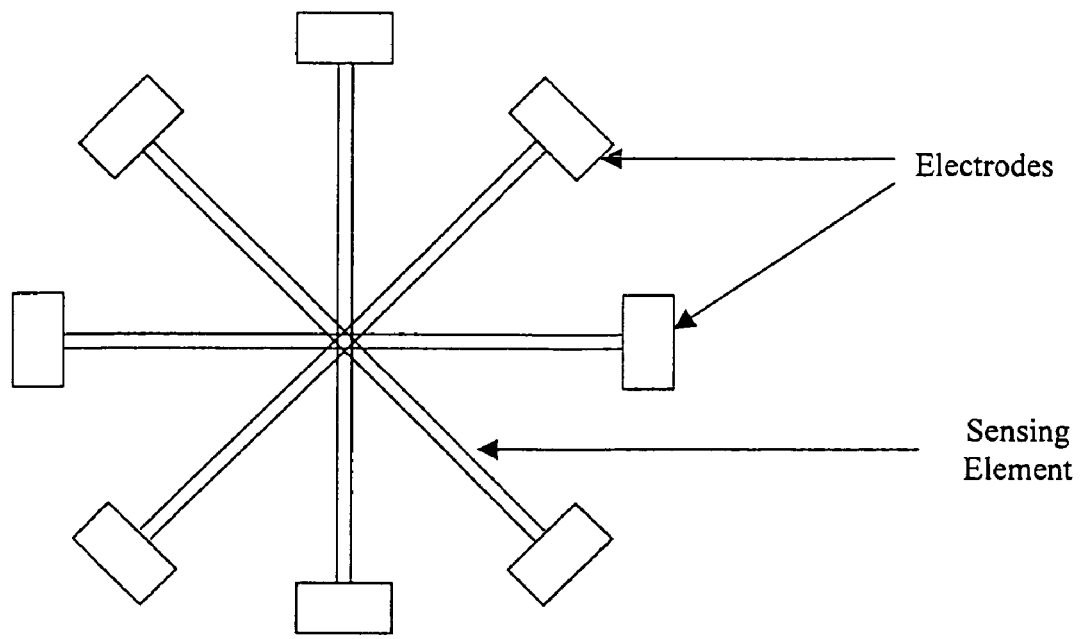
FIG. 1 shows an elevational view of a pattern that may be incorporated on fabrics which can be used for measuring strain in accordance with one embodiment of the invention.

FIG. 1 shows a pattern incorporated on fabrics, woven, knitted or non-woven, braids, can be used for measuring strain in various directions, i.e. 0°, 90° and ±45°. The directions are selected after considering the particular textile structure used in terms of its anisotropic properties.

Example 2

Shear Sensing Units

Figure 2:
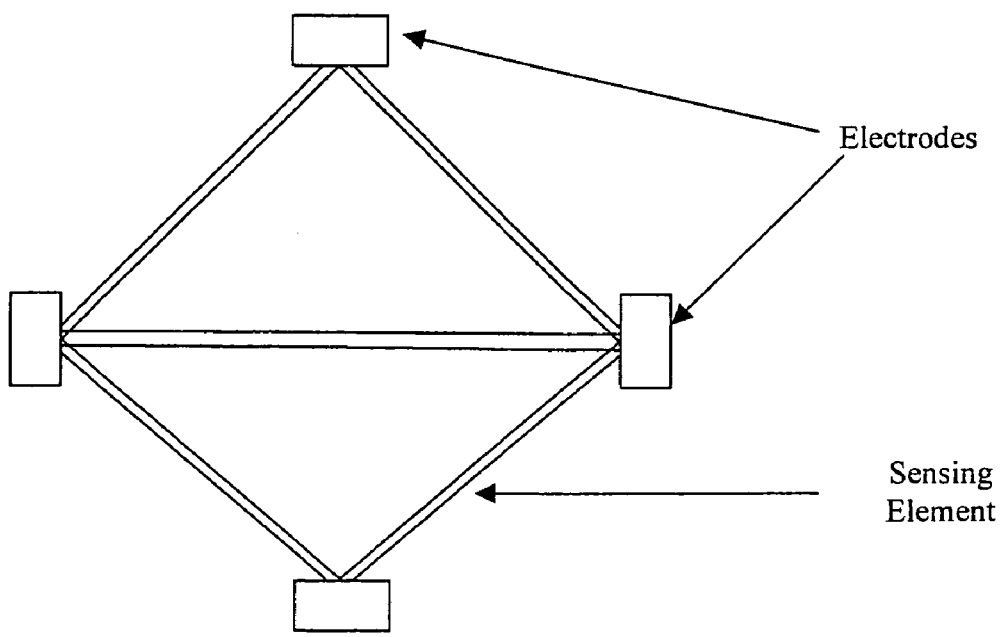
FIG. 2 shows an elevational view of a shear sensing unit in accordance with an embodiment of the invention.
Figure 3:
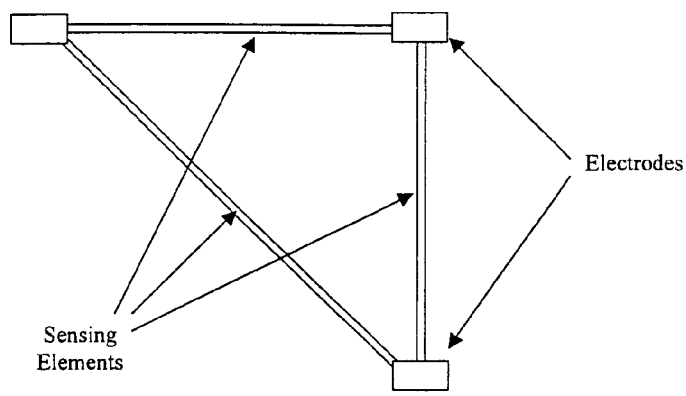
FIG. 3 shows an alternative pattern to that of FIG. 2.

Patterns in FIG. 2 and FIG. 3 can be incorporated to measure the in-plane shear of the structures. The directions are selected after considering the particular textile structure used in terms of its anisotropic properties.

Example 3

Simultaneous Measurement Unit for Temperature, Humidity and Strain

Figure 4:
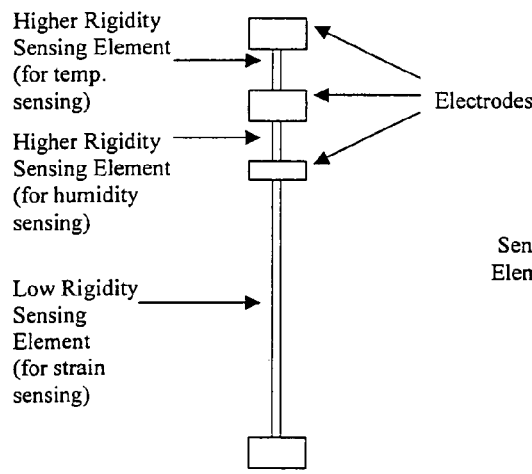
FIG. 4 provides an elevational view of a pattern printed on a textile in accordance with a yet further embodiment of the invention.

FIG. 4 shows a pattern that is printed on one-dimensional structures such as filament yarns, staple yarns, narrow fabrics such as two dimensional braids, tubular knits, woven fabrics etc. The conductive polymer is coated on the structure which has at least two parts, one has a modulus at least two to three order of magnitude higher than the other. The difference in rigidity can be achieved by stiffening by resin, by using different fiber types and by using textile or non-textile structures. The structure is used to measure strain, temperature and relative humidity simultaneously.

Example 4

Simultaneous Measurement Unit for Temperature, Humidity and Strain

Figure 5:
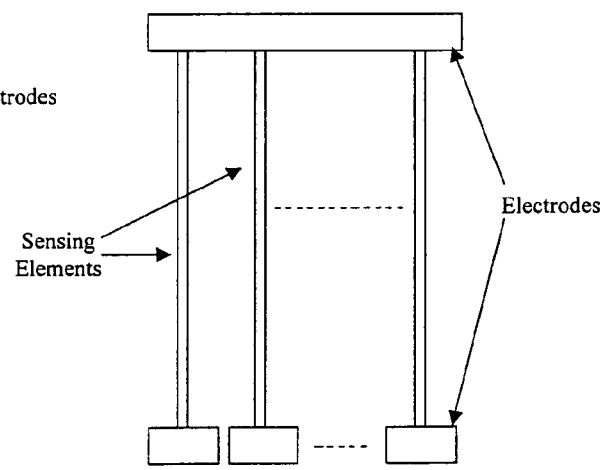
FIG. 5 provides a pattern as an alternative to that in FIG. 4.

The pattern as shown in FIG. 5 has three or more legs of measuring elements in one direction. Each leg has its own sensitivities to strain, temperature and humidity. Readings of resistance of each element are recorded and used to solve the set of simultaneous equations (linear or higher order). Thus the solutions are the required measured values.

The above patterns can be used individually or in combinations. They can be used for knitted (FIG. 6), woven (FIG. 7) and braid fabrics (FIG. 8) by careful selecting the structure and directions.

Fabrication Methods

Example 1

Application of an Oxidizing Agent Using Screen Printing Technique

Preparation of the Emulsion Thickener
The recipe for the emulsion thickener is as follows:

|  | Amount (g) |
|---|---|
| Emulsifier AC | 20 |
| White Spirit | 750 |
| Water | 230 |

The emulsifier AC is dissolved in water, then white spirit are added with high-speed stirring, which is continued until the mixture is thoroughly emulsified.

Printing of the Emulsion Thickener with Oxidizing Agent
For printing the oxidizing agent onto the fabric, the following recipe is used.

|  | Amount (g) |
|---|---|
| Emulsion thickener | 400 |
| Oxidizing agent ($FeCl_3$) | 43.2 |

(The amount of oxidizing agent used is 4 times of the amount of oxidizing agent used for chemical polymerization by exhaustion method)

The oxidizing agent is added-in the emulsion thickener with continuous stirring until the oxidizing agent is totally dissolved without phasing out the emulsion thickener.

The print paste consists the emulsion thickener and the oxidizing agent is printed on the substrate by screen printing technique.

Vapor Deposition of Pyrrole on the Printed Substrate
After printing, coating of pyrrole onto the substrate is carried out by exposing the printed substrate, while it is still wet, to an atmosphere saturated with pyrrole monomer vapor under vacuum condition at room temperature for 24 hours.

Example 2

Application of an Oxidizing Agent Using Padding Technique

Padding of Oxidizing Agent
The substrate (30 g) is padded with aqueous liquor at room temperature which contains per liter as follows:

|  | Amount (g) |
|---|---|
| Wetting agent | 5 |
| Oxidizing agent ($FeCl_3$) | 54 |

The required amount of oxidizing agent is dissolved into the water according to the concentration used and poured into the trough between two padding rollers and the uptake is adjusted to 70% on weight of the dry substrate. The fabric is passed through the nip of the rollers and the fabrics are collected.

Vapor Deposition of Pyrrole on the Printed Substrate
After padding, coating of pyrrole onto the substrate is carried out by exposing the printed substrate, while it is still wet, to an atmosphere saturated with pyrrole vapor under vacuum condition at room temperature for 24 hours.

Example 3

Application of an Oxidizing Agent Using Ink Jet Printing Technique

The oxidizing agent is dissolved in a volatile solvent and the liquid is jetted by the printing head of digital textile printer on the substrate. As the volatile solvent with the oxidizing agent reaches the surface, the solvent evaporates very quickly, leaving the oxidizing agent on the surface.

Vapor Deposition of Pyrrole on the Ink Jet Printed Substrate
After printing of oxidizing agent, coating of pyrrole onto the substrate is carried out by-exposing the printed substrate, while it is still wet, to an atmosphere saturated with pyrrole vapor under vacuum condition at room temperature for 24 hours.

Example 4

Vapor Deposition of Pyrrole Under the Electric-Field

The oxidizing agent is dissolved in an appropriate solvent and the liquid is applied by any of the above methods, jetted, screen-printed or padded onto the substrates.

Figure 9:
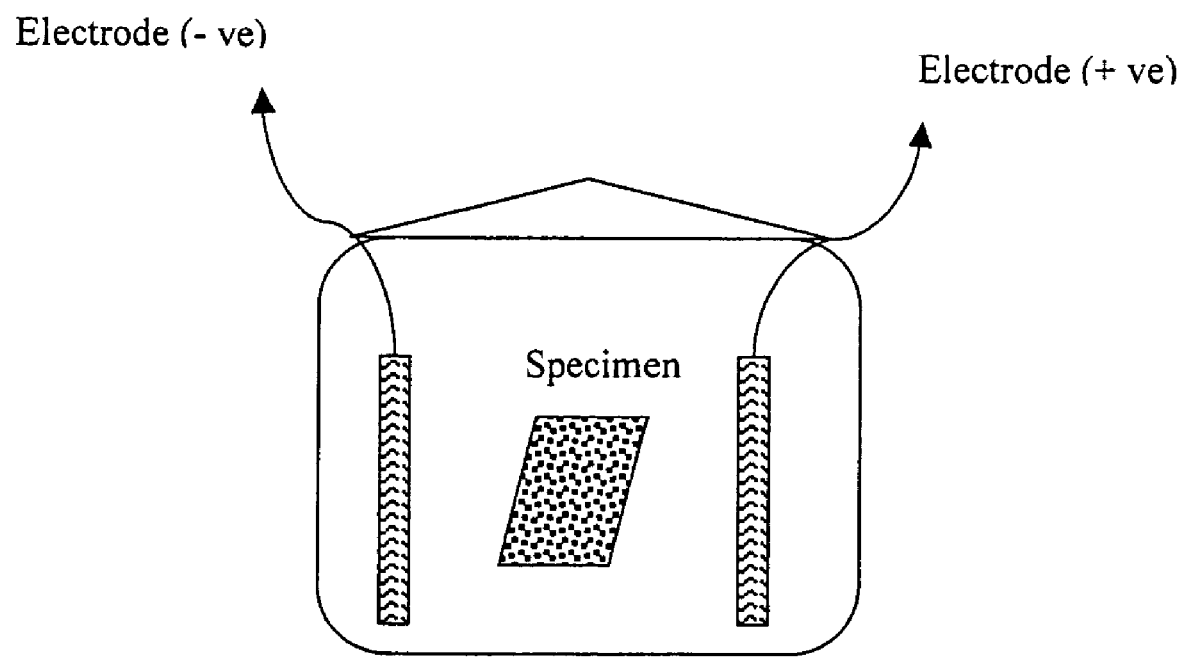
FIG. 9 shows an arrangement to apply an electrical field during a process used in an embodiment of the invention.

After printing of oxidizing agent, pyrrole is coated on the substrate by vapor deposition while it is still wet, at an atmosphere saturated with pyrrole vapor under vacuum condition at room temperature and applying the electric-field. By alternating the direction of the electrical field in either side-way, vertical or inclined in different angles, strength of voltage applied (5KV to 30KV), the morphology and orientation of polymer chains will be changed correspondingly. A general schematic of this arrangement is shown in FIG. 9.

Stabilization of the PPy-Coated Fabric
Many researchers have studied different methods to improve the stability of the PPy-coated fabrics according to the following:

1. By the use of different types of dopants
2. By acid/base treatment
3. By thermal degradation Our present work aims at stabilizing the PPy-coated fabric by the following new methods:

Example 1

After-Washing of the PPy-Coated Fabrics in Various Conditions

Up to now, only the washing fastness of the PPy-coated fabric has been studied and it was found that the washing fastness of the PPy-coated fabric was satisfactory. However, the change of electrical-resistance of the PPy-coated fabric towards various washing conditions was still unknown. It is believed that various washing conditions (e.g. different washing temperature, different types of detergents and different duration) will impact different effect on the properties (electrical properties, gauge factor, morphology etc.) of the PPy-coated fabrics and the washing process will also impact a stabilizing effect of the PPy-coated fabric by accelerate the ageing of the coated PPy.

Example 2

Radiation Treatment of the PPy-Coated Fabrics

This treatment is intended to stabilize the PPy-coated fabric by exposing it to various light sources (e.g. from a Xenon arc lamp used for assessing the light fastness of textile materials). It is believed that exposing the PPy-coated fabric to a strong light source will accelerate the ageing of the coated PPy and thus the degraded PPy will form a protective layer to retard further degradation.

Example 3

Applying High Voltage on the PPy-Coated Fabrics

It is suggested that post-treatment of the PPy-coated fabric by applying high voltage along with the PPy-coated fabric will improve the stability of the PPy-coated fabric. Also, it is believed that a stabilization effect can be obtained when a high voltage is applied during the vapor deposition of the monomer (pyrrole) onto the fabric by controlling the morphology of the PPy-coated fabric.

Thus it can be seen that the invention has outlined a variety of methods for the production of textile sensors using conductive fabrics arrays which are relatively quick and simple, yet also allow arrangement of the arrays to suit particular needs of different sensors.

This description has made reference to specific embodiments in an illustrative manner and the invention should be considered broadly in accordance with the general disclosure. Any specific integers referred to throughout the description are deemed to incorporate known equivalents where appropriate.

The invention claimed is:

1. A method for the production of conductive flexible textile arrays comprising:
   applying an oxidising agent to selected areas of the textile;
   coating the textile with pyrrole by vapour deposition to form a conductive polypyrrole coated textile;
   stabilising the conductive polypyrrole coated textile by exposing the conductive polypyrrole coated textile to a radiating light source to degrade the polypyrrole; and
   forming the conductive flexible textile arrays as a sensor.

2. A method for the production of conductive flexible textile arrays as claimed in claim 1 wherein said oxidising agent is applied by a jet spray technique.

3. A method for the production of conductive flexible textile arrays as claimed in claim 1 wherein said oxidising agent is applied by screen printing.

4. A method for the production of conductive flexible textile arrays as claimed in claim 1 wherein said oxidising agent is applied by inkjet printing.

5. A method for the production of conductive flexible textile arrays as claimed in claim 1 wherein said oxidising agent is applied by padding.

6. A method for the production of conductive flexible textile arrays as claimed in claim 1 wherein said pyrrole is applied by exposure of the textile with the oxidising agent still wet to an atmosphere saturated with pyrrole monomer vapor under a vacuum.

7. A method for the production of conductive flexible textile arrays as claimed in claim 6 wherein said deposition occurs at substantially room temperature and continues for approximately 24 hours.

8. A method for the production of conductive flexible textile arrays comprising
   applying an oxidising agent to selected areas of the textile;
   coating the textile with pyrrole by vapour deposition to form a conductive polypyrrole coated textile;
   stabilising the conductive polypyrrole coated textile by exposing the conductive polypyrrole coated textile to a washing process to age the coating; and
   forming the conductive flexible textile arrays as a sensor.

9. A method for the production of conductive flexible textile arrays comprising
   applying an oxidising agent to selected areas of the textile;
   coating the textile with pyrrole by vapour deposition to form a conductive polypyrrole coated textile;
   stabilising the conductive polypyrrole coated textile by exposing the conductive polypyrrole coated textile to application of an electrical current to the polypyrrole coated textile; and
   forming the conductive flexible textile arrays as a sensor.

10. A method for the production of conductive flexible textile arrays as claimed in claim 9 wherein said stabilising includes applying an electrical current to the textile during the vapor deposition of the pyrrole onto the textile to control the morphology of the conductive coated textile.

* * * * *